United States Patent
Tsunoe

(10) Patent No.: US 10,241,395 B2
(45) Date of Patent: Mar. 26, 2019

(54) PATTERN CORRECTION AMOUNT CALCULATING APPARATUS, PATTERN CORRECTION AMOUNT CALCULATING METHOD, AND STORAGE MEDIUM

(71) Applicant: NIPPON CONTROL SYSTEM CORPORATION, Tokyo (JP)

(72) Inventor: Hiroyuki Tsunoe, Kanagawa (JP)

(73) Assignee: Nippon Control System Corporation, Tokyo (JP)

( * ) Notice: Subject to any disclaimer, the term of this patent is extended or adjusted under 35 U.S.C. 154(b) by 19 days.

(21) Appl. No.: 15/512,351

(22) PCT Filed: Jul. 3, 2015

(86) PCT No.: PCT/JP2015/069265
§ 371 (c)(1),
(2) Date: Mar. 17, 2017

(87) PCT Pub. No.: WO2016/063580
PCT Pub. Date: Apr. 28, 2016

(65) Prior Publication Data
US 2017/0277035 A1    Sep. 28, 2017

(30) Foreign Application Priority Data
Oct. 21, 2014   (JP) ................................. 2014-214382

(51) Int. Cl.
*G03F 1/78*    (2012.01)
*G03F 1/70*    (2012.01)
(Continued)

(52) U.S. Cl.
CPC .................. *G03F 1/78* (2013.01); *G03F 1/36* (2013.01); *G03F 1/70* (2013.01); *G03F 7/20* (2013.01);
(Continued)

(58) Field of Classification Search
CPC ......................................................... G03F 1/78
(Continued)

(56) References Cited

U.S. PATENT DOCUMENTS 5,631,110 A    5/1997  Shioiri et al.
6,824,937 B1 *  11/2004  Haidinyak ................ G03F 1/36
                                                    382/144
(Continued)

FOREIGN PATENT DOCUMENTS

JP        4-181715 A    6/1992
JP        6-110976 A    4/1994
(Continued)

OTHER PUBLICATIONS

International Search Report dated Sep. 29, 2015, in corresponding PCT/JP2015/069265, with English language translation.
(Continued)

*Primary Examiner* — Suresh Memula
(74) *Attorney, Agent, or Firm* — McDermott Will & Emery LLP

(57) ABSTRACT

A pattern correction amount calculating apparatus includes: an accepting unit that accepts pattern information; a micro side group acquiring unit that acquires a micro side group, which is a group of continuous sides forming a contour of a pattern figure indicated by the pattern information, and is a group of micro sides that are each small enough to satisfy a predetermined condition; a virtual side acquiring unit that acquires a virtual side, which is a side that approximates micro sides contained in the micro side group; a virtual side correction amount calculating unit that calculates a virtual side correction amount, which is a correction amount for the virtual side; and a micro side correction amount calculating unit that calculates micro side correction amounts, which are correction amounts respectively for the micro sides con- (Continued)

tained in the micro side group corresponding to the virtual side, using the virtual side correction amount.

11 Claims, 22 Drawing Sheets

(51) Int. Cl.
*G03F 7/20* (2006.01)
*G03F 1/36* (2012.01)
*H01L 21/027* (2006.01)
*H01J 37/302* (2006.01)

(52) U.S. Cl.
CPC .......... *G03F 7/705* (2013.01); *G03F 7/70433* (2013.01); *G03F 7/70441* (2013.01); *H01J 37/3026* (2013.01); *H01L 21/027* (2013.01)

(58) Field of Classification Search
USPC ......................................................... 716/51
See application file for complete search history.

(56) References Cited

U.S. PATENT DOCUMENTS

| | | | | |
|---|---|---|---|---|
| 6,893,800 | B2* | 5/2005 | Jessen | G03F 1/36 216/38 |
| 8,828,628 | B2* | 9/2014 | Fujimura | B82Y 10/00 430/296 |
| 2003/0008215 | A1* | 1/2003 | Mukherjee | G03F 1/36 430/5 |
| 2003/0203287 | A1* | 10/2003 | Miyagawa | B82Y 10/00 430/5 |
| 2004/0219436 | A1* | 11/2004 | Zhang | G03F 1/30 430/5 |
| 2007/0037066 | A1* | 2/2007 | Hsiao | G03F 1/36 430/5 |
| 2008/0003510 | A1* | 1/2008 | Harazaki | G03F 1/36 430/5 |
| 2010/0055585 | A1* | 3/2010 | Fujimura | B82Y 10/00 430/30 |
| 2015/0017572 | A1* | 1/2015 | Ishii | G03F 1/36 430/5 |
| 2015/0286131 | A1* | 10/2015 | Cheng | G03F 1/36 430/5 |

FOREIGN PATENT DOCUMENTS

| | | |
|---|---|---|
| JP | 9-34097 A | 2/1997 |
| JP | 2003-309065 A | 10/2003 |
| JP | 2004-355644 A | 12/2004 |
| JP | 2012-042498 A | 3/2012 |
| TW | 201433886 A | 9/2014 |

OTHER PUBLICATIONS

"Caliber MPCpro," Mentor Graphics Japan Co., Ltd., accessed on Sep. 24, 2014, www.mentorg.co.jp/products/c-manufacturing/mask-process-correction/calibre-mpcpro.html, with English language translation.

"Caliber OPCpro," Mentor Graphics Japan Co., Ltd., accessed on Sep. 24, 2014, www.mentorg.co.jp/products/c-manufacturing/computational-lithograph/calibre-opcpro.html, with English language translation.

Extended European Search Report issued in corresponding European Patent Application No. 15852293.8, dated May 7, 2018.

Office Action issued in corresponding Japanese Patent Application No. 2014-214382, dated May 29, 2018.

Taiwanese Office Action dated Nov. 2, 2018 issued in Taiwanese Patent Application No. 104130760 (with English translation).

* cited by examiner

| ID | Vertex 1 | Vertex 2 |
|---|---|---|
| . | . | . |
| . | . | . |
| . | . | . |
| 011 | (10,10) | (10,16) |
| 012 | (10,16) | (16,16) |
| 013 | (16,16) | (16,24) |
| 014 | (16,24) | (30,24) |
| 015 | (30,24) | (30,32) |
| 016 | (30,32) | (42,32) |
| 017 | (42,32) | (42,45) |
| 018 | (42,45) | (50,45) |
| 019 | (50,45) | (50,70) |
| 020 | (50,70) | (80,70) |
| . | . | . |
| . | . | . |
| . | . | . |

FIG.7

| ID  | Vertex 1   | Vertex 2  | Group ID |
|-----|------------|-----------|----------|
| .   | .          | .         | .        |
| .   | .          | .         | .        |
| .   | .          | .         | .        |
| 011 | (80,80)    | (80,81)   | 004      |
| 012 | (80,81)    | (81,81)   | 004      |
| 013 | (81,81)    | (81,83)   | 004      |
| 014 | (81,83)    | (82,83)   | 004      |
| 015 | (82,83)    | (82,85)   | 004      |
| 016 | (82,85)    | (83,85)   | 004      |
| 017 | (100,100)  | (100,99)  | 005      |
| 018 | (100,99)   | (98,99)   | 005      |
| 019 | (98,99)    | (98,97)   | 005      |
| 020 | (98,97)    | (97,97)   | 005      |
| .   | .          | .         | .        |
| .   | .          | .         | .        |
| .   | .          | .         | .        |

FIG.9

| ID | Vertex 1 | Vertex 2 | Group ID | Virtual side |
|---|---|---|---|---|
| . | . | . | . | . |
| . | . | . | . | . |
| . | . | . | . | . |
| 011 | (80,80) | (80,81) | 004 | {(80,80),(81,81),···,(83,84),(83,85)} |
| 012 | (80,81) | (81,81) | 004 | {(80,80),(81,81),···,(83,84),(83,85)} |
| 013 | (81,81) | (81,83) | 004 | {(80,80),(81,81),···,(83,84),(83,85)} |
| 014 | (81,83) | (82,83) | 004 | {(80,80),(81,81),···,(83,84),(83,85)} |
| 015 | (82,83) | (82,85) | 004 | {(80,80),(81,81),···,(83,84),(83,85)} |
| 016 | (82,85) | (83,85) | 004 | {(80,80),(81,81),···,(83,84),(83,85)} |
| 017 | (100,100) | (100,99) | 005 | {(100,100),(99,99),···,(94,94),(95,95)} |
| 018 | (100,99) | (98,99) | 005 | {(100,100),(99,99),···,(94,94),(95,95)} |
| 019 | (98,99) | (98,97) | 005 | {(100,100),(99,99),···,(94,94),(95,95)} |
| 020 | (98,97) | (97,97) | 005 | {(100,100),(99,99),···,(94,94),(95,95)} |
| . | . | . | . | . |
| . | . | . | . | . |
| . | . | . | . | . |

| ID | Vertex 1 | Vertex 2 | Group ID | Virtual side | Virtual side correction amount |
|---|---|---|---|---|---|
| ... | ... | ... | ... | ... | ... |
| 011 | (80,80) | (80,81) | 004 | {(80,80),(81,81),...,(83,84),(83,85)} | 5 |
| 012 | (80,81) | (81,81) | 004 | {(80,80),(81,81),...,(83,84),(83,85)} | 5 |
| 013 | (81,81) | (81,83) | 004 | {(80,80),(81,81),...,(83,84),(83,85)} | 5 |
| 014 | (81,83) | (82,83) | 004 | {(80,80),(81,81),...,(83,84),(83,85)} | 5 |
| 015 | (82,83) | (82,85) | 004 | {(80,80),(81,81),...,(83,84),(83,85)} | 5 |
| 016 | (82,85) | (83,85) | 004 | {(80,80),(81,81),...,(83,84),(83,85)} | 5 |
| 017 | (100,100) | (100,99) | 005 | {(100,100),(99,99),...,(94,94),(95,95)} | 8 |
| 018 | (100,99) | (98,99) | 005 | {(100,100),(99,99),...,(94,94),(95,95)} | 8 |
| 019 | (98,99) | (98,97) | 005 | {(100,100),(99,99),...,(94,94),(95,95)} | 8 |
| 020 | (98,97) | (97,97) | 005 | {(100,100),(99,99),...,(94,94),(95,95)} | 8 |
| ... | ... | ... | ... | ... | ... |

| ID | Vertex 1 | Vertex 2 | Group ID | Virtual side | Virtual side correction amount | Micro side correction amount |
|---|---|---|---|---|---|---|
| ... | ... | ... | ... | ... | ... | ... |
| 011 | (80,80) | (80,81) | 004 | {(80,80),(81,81),...,(83,84),(83,85)} | 5 | 3 |
| 012 | (80,81) | (81,81) | 004 | {(80,80),(81,81),...,(83,84),(83,85)} | 5 | 4 |
| 013 | (81,81) | (81,83) | 004 | {(80,80),(81,81),...,(83,84),(83,85)} | 5 | 3 |
| 014 | (81,83) | (82,83) | 004 | {(80,80),(81,81),...,(83,84),(83,85)} | 5 | 4 |
| 015 | (82,83) | (82,85) | 004 | {(80,80),(81,81),...,(83,84),(83,85)} | 5 | 3 |
| 016 | (82,85) | (83,85) | 004 | {(80,80),(81,81),...,(83,84),(83,85)} | 5 | 4 |
| 017 | (100,100) | (100,99) | 005 | {(100,100),(99,99),...,(94,94),(95,95)} | 8 | 8 |
| 018 | (100,99) | (98,99) | 005 | {(100,100),(99,99),...,(94,94),(95,95)} | 8 | 8 |
| 019 | (98,99) | (98,97) | 005 | {(100,100),(99,99),...,(94,94),(95,95)} | 8 | 8 |
| 020 | (98,97) | (97,97) | 005 | {(100,100),(99,99),...,(94,94),(95,95)} | 8 | 8 |
| ... | ... | ... | ... | ... | ... | ... |

FIG. 14

PATTERN CORRECTION AMOUNT CALCULATING APPARATUS, PATTERN CORRECTION AMOUNT CALCULATING METHOD, AND STORAGE MEDIUM

CROSS REFERENCE

This application is the U.S. National Phase under 35 U.S.C. § 371 of International Application No. PCT/JP2015/069265, filed on Jul. 3, 2015, which claims the benefit of Japanese Application No. 2014-214382, filed on Oct. 21, 2014, the entire contents of each are hereby incorporated by reference.

TECHNICAL FIELD

The present invention relates to a pattern correction amount calculating apparatus and the like for calculating a proper correction amount for each of two or more continuous micro sides in a pattern figure such as a mask layout.

BACKGROUND ART

Conventionally, apparatuses for performing MPC (mask process correction), OPC (optical proximity correction), and the like have been developed (see Non-Patent Documents 1 and 2).

CITATION LIST

Non-Patent Document

Non-Patent Document 1: "Calibre MPCpro", online, Mentor Graphics Japan Co., Ltd., accessed on Sep. 24, 2014, Internet address URL; http://www.mentorg.co.jp/products/ic-manufacturing/mask-process-correction/calibre-mp-cpro.html Non-Patent Document 2: "Calibre OPCpro", online, Mentor Graphics Japan Co., Ltd., accessed on Sep. 24, 2014, Internet address URL; http://www.mentorg.co.jp/products/ic-manufacturing/computational-lithography/calibre-op-cpro.html

SUMMARY OF INVENTION

Technical Problem

With conventional apparatuses and the like, if a pattern figure called a layout pattern, a mask pattern, or the like has a portion in which two or more micro sides, each of which is a side that is small enough to satisfy a predetermined condition, are continuously arranged, it is not possible to calculate a proper correction amount for each of the two or more continuous micro sides.

Solution to Problem

A first aspect of the present invention is directed to a pattern correction amount calculating apparatus, including: an accepting unit that accepts pattern information, which is information indicating a pattern figure that is to be written by an electron beam writer; a micro side group acquiring unit that acquires a micro side group, which is a group of two or more continuous sides forming a contour of the pattern figure indicated by the pattern information, and is a group of micro sides that are each small enough to satisfy a predetermined condition, using the pattern information; a virtual side acquiring unit that acquires a virtual side, which is a side that approximates two or more micro sides contained in the micro side group; a virtual side correction amount calculating unit that calculates a virtual side correction amount, which is a correction amount for the virtual side; a micro side correction amount calculating unit that calculates two or more micro side correction amounts, which are correction amounts respectively for the two or more micro sides contained in the micro side group corresponding to the virtual side, using the virtual side correction amount; and an output unit that outputs the two or more micro side correction amounts.

With this configuration, it is possible to calculate a proper correction amount for each of two or more continuous micro sides.

Furthermore, a second aspect of the present invention is directed to the pattern correction amount calculating apparatus according to the first aspect, wherein the virtual side acquiring unit acquires, as a virtual side, a line segment connecting points respectively on two end sides contained in the micro side group.

With this configuration, it is possible to calculate a proper correction amount for each of two or more continuous micro sides, using a virtual side connecting points respectively on two end sides contained in a micro side group.

Furthermore, a third aspect of the present invention is directed to the pattern correction amount calculating apparatus according to the first or second aspect, wherein, in a case where the micro side group has one or more turn-backs, the virtual side acquiring unit acquires, as virtual sides, two or more line segments sequentially connecting points respectively on one or more sides corresponding to the turn-backs and points respectively on two end sides contained in the micro side group.

With this configuration, also in a case where a micro side group has a turn-back, it is possible to calculate a proper correction amount for each of two or more continuous micro sides contained in the micro side group.

Furthermore, a fourth aspect of the present invention is directed to the pattern correction amount calculating apparatus according to the second or third aspect, wherein the points on the end sides are endpoints of the end sides.

With this configuration, it is possible to calculate a proper correction amount for each of two or more continuous micro sides, using a virtual side connecting endpoints of two end sides contained in a micro side group.

Furthermore, a fifth aspect of the present invention is directed to the pattern correction amount calculating apparatus according to the third aspect, wherein the points on the sides corresponding to the turn-backs are midpoints of the sides corresponding to the turn-backs.

With this configuration, also in a case where a micro side group has a turn-back, it is possible to calculate a proper correction amount for each of two or more continuous micro sides contained in the micro side group.

Furthermore, a sixth aspect of the present invention is directed to the pattern correction amount calculating apparatus according to any one of the first to fifth aspects, wherein the micro side correction amount calculating unit calculates the two or more micro side correction amounts, using the virtual side correction amount, and angles of the two or more micro sides contained in the micro side group relative to the virtual side.

With this configuration, it is possible to calculate a proper correction amount for each of two or more continuous micro side, using a virtual side correction amount, and angles of two or more micro sides relative to the virtual side.

Furthermore, a seventh aspect of the present invention is directed to the pattern correction amount calculating apparatus according to the sixth aspect, wherein the micro side correction amount calculating unit calculates the two or more micro side correction amounts, by dividing the virtual side correction amount into components of angles of the two or more micro sides contained in the micro side group relative to the virtual side, using a trigonometric function.

With this configuration, it is possible to calculate a proper correction amount for each of two or more continuous micro sides, by dividing a virtual side correction amount into components of angles of two or more micro sides relative to the virtual side, using a trigonometric function.

Furthermore, an eighth aspect of the present invention is directed to the pattern correction amount calculating apparatus according to any one of the first to seventh aspects, for example, wherein each of the micro sides has a length of 100 nanometers or less.

With this configuration, for example, it is possible to calculate a proper correction amount for each of two or more micro sides each having a length of 100 nanometers or less.

Furthermore, a ninth aspect of the present invention is directed to the pattern correction amount calculating apparatus according to any one of the first to eighth aspects, wherein two or more sides forming the pattern figure are sides in which two adjacent sides form a right angle.

With this configuration, it is possible to calculate a proper correction amount for each of two or more continuous micro sides, in a pattern figure formed by a group of two or more sides forming a right angle.

Advantageous Effects of Invention

With the pattern correction amount calculating apparatus and the like according to the present invention, it is possible to calculate a proper correction amount for each of two or more continuous micro sides.

BRIEF DESCRIPTION OF DRAWINGS

FIG. 7 is a diagram showing an example of pattern information of this embodiment.

FIG. 9 is a diagram showing an example of micro side group information of this embodiment.

FIG. 12 is a diagram showing an example of a calculation result of virtual side information of this embodiment.

FIG. 13 is a diagram showing an example of a calculation result of virtual side correction amounts of this embodiment.

FIG. 14 is a diagram showing an example of a calculation result of micro side correction amounts of this embodiment.

DESCRIPTION OF EMBODIMENT

Figure 1:
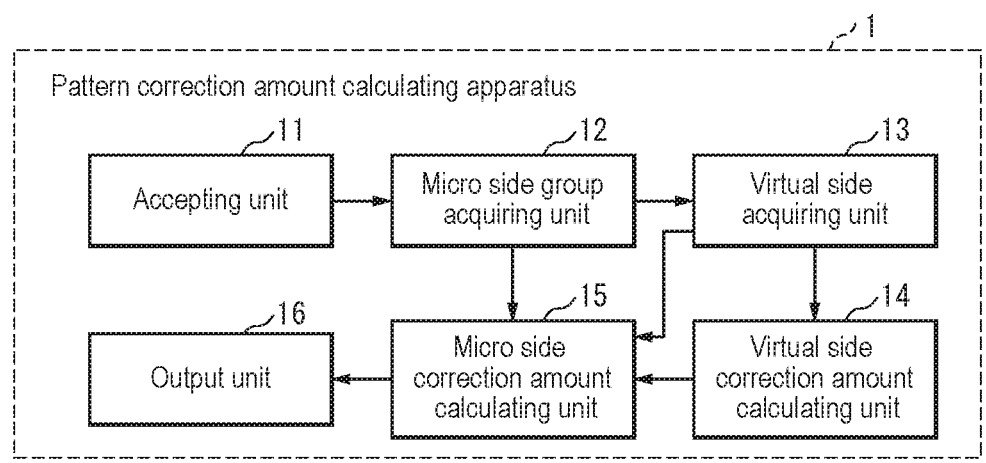
FIG. 1 is a block diagram of a pattern correction amount calculating apparatus 1 in Embodiment 1.

Hereinafter, an embodiment of a pattern correction amount calculating apparatus and the like according to the present invention will be described with reference to the drawings. It should be noted that constituent elements denoted by the same reference numerals in the embodiment perform similar operations, and thus a description thereof may not be repeated. The formats, the content, and the like of each piece of information described in the embodiment are merely an example, and there is no limitation on the formats, the content, and the like, as long as the meaning of each piece of information can be represented.

Embodiment 1

In this embodiment, a pattern correction amount calculating apparatus 1 will be described that acquires a micro side group, which is a group of two or more continuous micro sides, from a contour of a pattern figure, and calculates a proper correction amount for each of the two or more micro sides contained in the micro side group. Note that "proper correction amount" refers to a correction amount that is similar to a correction amount for each of sides other than the micro sides, a correction amount whose difference from a correction amount for each of sides other than the micro sides is small enough to satisfy a predetermined condition, a correction amount that does not cause shape deformation of the pattern figure, or the like.

FIG. 1 is a block diagram of the pattern correction amount calculating apparatus 1 in this embodiment. The pattern correction amount calculating apparatus 1 includes an accepting unit 11, a micro side group acquiring unit 12, a virtual side acquiring unit 13, a virtual side correction amount calculating unit 14, a micro side correction amount calculating unit 15, and an output unit 16.

The accepting unit 11 accepts pattern information. The accepting is a concept that encompasses acquiring information selected or input by an input device such as a touch panel or a keyboard, reading information stored in a storage medium such as an optical disk, a magnetic disk, or a semiconductor memory and receiving information transmitted via a wired or wireless communication line.

Furthermore, the pattern information is information indicating a pattern figure. The pattern figure is a figure that is to be written by an electron beam writer. The pattern information is, for example, data called layout data, pattern data, or the like. There is no limitation on the data format of the pattern information. The data format of the pattern information is typically a data format called mask design data, layout design data, or the like. A specific data format of the pattern information is, for example, GDS-2, OASIS, MEBES, or the like. Note that the pattern information typically indicates one or at least two pattern figures.

Furthermore, the pattern information is, for example, information having three or more sets of coordinates. The coordinates are information indicating vertices of a pattern figure. The vertices are endpoints of sides of the pattern figure. That is to say, typically, two sets of coordinates that are adjacent to each other in pattern information are also referred to as information indicating a side of a pattern figure. Each set of coordinates includes two numerical values consisting of an x coordinate and a y coordinate. The numerical values are typically integers, but may also be decimals. The pattern information is, for example, information having three or more coordinate pairs. Each coordinate pair is a pair of sets of coordinates, and is information associated with two sets of coordinates. The coordinate pair is information indicating endpoints of a side of a pattern figure. The endpoints are also vertices of the pattern figure. The coordinate pair is also referred to, for example, as information indicating a side of a pattern figure. Accordingly, the pattern figure is, for example, a figure having three or more vertices. The pattern figure is, for example, a figure having three or more sides.

Furthermore, the pattern information is typically associated with information indicating a scale. With this information, a size of the pattern figure indicated by the pattern information, a length of sides contained in the pattern figure, and the like can be calculated.

Furthermore, in the pattern figure, there is no limitation on the angle between two adjacent sides. The being adjacent is, for example, a state in which one endpoint contained in one side and another endpoint contained in another side are the same. The angle is typically an interior angle or a minor angle, but may also be an exterior angle or a major angle. The angle is preferably a right angle (90°). In other words, in the pattern figure, the two adjacent sides are preferably sides forming a right angle. In other words, in the pattern figure, it is preferable that the angle at each of the three or more vertices is, for example, a right angle. That is to say, it is preferable that the pattern figure is, for example, a figure having four or more vertices, and a figure having four or more sides. It is preferable that, if the angle between two adjacent sides is a right angle, four or more sides contained in the pattern figure are, for example, line segments in the horizontal direction or the perpendicular direction. The angle between two adjacent sides in the pattern figure may be, for example, 45°, 135°, 225°, 315°, or the like.

Furthermore, the sides of the pattern figure are also referred to as sides contained in the pattern figure, sides forming a contour of the pattern figure, sides contained in a contour of the pattern figure, or the like. The vertices of the pattern figure are also referred to as vertices contained in the pattern figure, vertices forming a contour of the pattern figure, vertices contained in the pattern figure, or the like.

The accepting unit 11 may accept information, an instruction, or the like input via any part such as a menu screen, a keyboard, or the like. The accepting unit 11 may be realized by control software for a menu screen, or a device driver for an input part such as a keyboard, for example.

The micro side group acquiring unit 12 acquires a micro side group from a pattern figure. The pattern figure is indicated by the pattern information accepted by the accepting unit 11. That is to say, using the pattern information, the micro side group acquiring unit 12 acquires a micro side group contained in the pattern figure indicated by the pattern information. The micro side group is a group of two or more continuous micro sides. In other words, the two or more micro sides contained in the micro side group are continuous. The being continuous is, for example, being continuously arranged so as to be adjacent to each other. The micro sides are sides that are each small enough to satisfy a predetermined condition (hereinafter, referred to as a micro side condition, as appropriate). The micro sides contained in the micro side group are sides forming the micro side group. The micro side group is typically part of the contour of the pattern figure.

For example, it is assumed that five sides that are continuous in a pattern figure are a side A, a side B, a side C, a side D, and a side E. For example, it is assumed that, among the five sides, the side B, the side C, and the side D are micro sides, and the other sides are sides that are not micro sides (hereinafter, referred to as non-micro sides, as appropriate). In this case, the side B, the side C, and the side D are in a micro side group. Meanwhile, it is assumed that, among the five sides, only the side B is a micro side, and the other sides are non-micro sides. In this case, the side B is a single micro side, and is not in a micro side group.

Furthermore, the micro side condition is a condition regarding a length of a side. The micro side condition is, for example, that the length of a side is at a predetermined threshold or less. "Or less" may also be, for example, "less than". There is no limitation on the threshold (the threshold may be freely selected). The threshold is, for example, 100 nanometers.

Furthermore, the acquiring a micro side group is acquiring information indicating a micro side group (hereinafter, referred to as micro side group information, as appropriate). The micro side group information is, for example, information having three or more sets of coordinates. Each set of coordinates is information indicating a vertex contained in the micro side group. That is to say, the micro side group has three or more vertices. Note that, among the three or more vertices, two vertices are typically endpoints of the micro side group. The micro side group information is, for example, information having two or more coordinate pairs. Each of the coordinate pairs is information indicating endpoints of a micro side contained in the micro side group. The endpoints are also vertices of the pattern figure. The coordinate pair is also referred to as, for example, information indicating a micro side contained in the micro side group. That is to say, the micro side group has, for example, two or more micro sides.

Specifically, for example, using the pattern information, the micro side group acquiring unit 12 sequentially determines whether or not each of the three or more sides contained in the pattern figure is a micro side. The determining whether or not it is a micro side is determining whether or not the length of the side targeted for this determination satisfies the micro side condition. If the length of the side satisfies the micro side condition, the micro side group acquiring unit 12 determines that the side is a micro side. If the length of the side does not satisfy the micro side condition, the micro side group acquiring unit 12 determines that the side is a non-micro side. The determining that it is a non-micro side is the same as determining that it is not a micro side. Upon determining that two or more sides are continuous micro sides, for example, the micro side group acquiring unit 12 acquires the two or more sides. The acquiring sides is, for example, acquiring information indicating the sides. For example, each time acquiring one side, the micro side group acquiring unit 12 acquires two sets of coordinates.

For example, it is assumed that five sides that are continuous in a pattern figure are a side A, a side B, a side C, a side D, and a side E. For example, it is assumed that, among the five sides, the side B, the side C, and the side D are micro sides, and the other sides are non-micro sides. In this case, the micro side group acquiring unit 12 first determines, for example, that the side A is a non-micro side. Next, the micro side group acquiring unit 12 determines that the side B is a micro side. Next, the micro side group acquiring unit 12 determines that the side C, which is continuous with the side B, is also a micro side. Next, the micro side group acquiring unit 12 determines that the side D, which is continuous with the side C, is also a micro side. Next, the micro side group acquiring unit 12 determines that the side E is a non-micro side. In this case, since it is determined that a side is a micro side successively three times, the micro side group acquiring unit 12 acquires the side B, the side C, the side D that are determined as being the micro sides. Note that the acquiring the continuous micro sides is hereinafter referred to as acquiring a series of micro sides, as appropriate.

Furthermore, for example, it is assumed that, among the five sides, only the side B is a micro side, and the other sides are non-micro sides. In this case, for example, the micro side group acquiring unit 12 first determines that the side A is a non-micro side. Next, the micro side group acquiring unit 12 determines that the side B is a micro side. Next, the micro side group acquiring unit 12 determines that the side C is a non-micro side. In this case, since it is not determined that a side is a micro side successively twice or more, the micro side group acquiring unit 12 acquires no side. Next, the micro side group acquiring unit 12 determines that the side D, which is continuous with the side C, is also a non-micro side. Next, the micro side group acquiring unit 12 determines that the side E, which is continuous with the side D, is also a non-micro side.

For example, each time acquiring a series of micro sides, the micro side group acquiring unit 12 may provide a micro side group acquired by the acquisition of the series of micro sides, with information for identifying the micro side group. The micro side group acquiring unit 12 typically acquires zero or at least one micro side group. The micro side group acquiring unit 12 may delete overlapping coordinates in acquired one piece of micro side group information.

The virtual side acquiring unit 13 acquires one or more virtual sides for each of the one or more micro side groups. The micro side groups are indicated by the micro side group information acquired by the micro side group acquiring unit 12. That is to say using one or more pieces of micro side group information, the virtual side acquiring unit 13 acquires virtual sides for micro side groups indicated by the one or more pieces of micro side group information. The virtual side is, for example, a side that is virtually disposed for one micro side group. The virtual side may be, for example, a side that is an alternative to one micro side group, a side that replaces one micro side group, a side for taking one micro side group as one side, a side that approximates two or more micro sides contained in a micro side group, a side that approximates three or more vertices contained in a micro side group, a line segment whose endpoints are points on two or more micro sides contained in a group, or the like Furthermore, the acquiring a virtual side is acquiring information indicating a virtual side (hereinafter, referred to as virtual side information, as appropriate). The virtual side information is, for example, information having two or more sets of coordinates. Each set of coordinates is information indicating a point on the virtual side. The virtual side information is, for example, a function (numerical formula). The function is typically a linear function. The virtual side acquiring unit 13 acquires virtual side information indicating each of one or more virtual sides.

Figure 2:
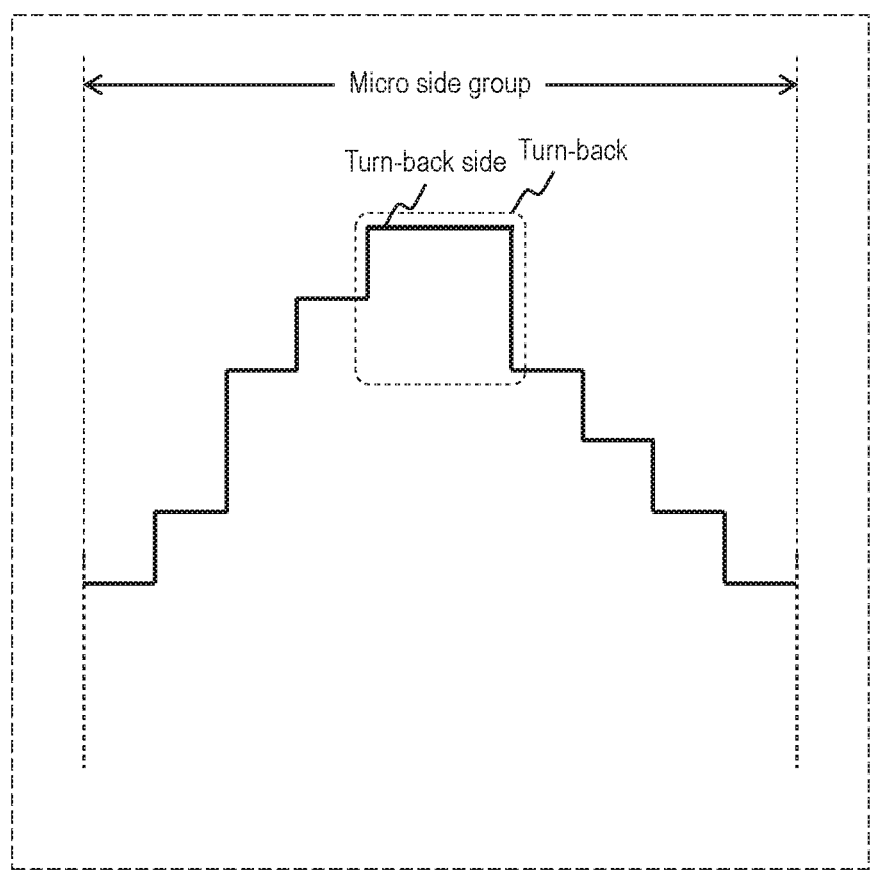
FIG. 2 is a diagram showing an example of a turn-back and a turn-back side of this embodiment.

Hereinafter, the method, the procedure, and the like for acquiring a virtual side will be described in each of the cases where a micro side group has a turn-back and where a micro side group does not have a turn-back. Note that the turn-back has, for example, a so-called squared U-shape. The turn-back is also referred to as, for example, a portion in which, when sequentially tracing sides forming a contour of a pattern figure in one direction (e.g., right-hand turning or left-hand turning), the movement direction is reversed. The turn-back is also referred to as, for example, a portion in which, when micro sides contained in the micro side group are expressed by a function (numerical formula), a slope of the function is reversed. The turn-back is typically constituted by three sides. In other words, the turn-back typically has three sides. Hereinafter, a side corresponding to the turn-back (hereinafter, referred to as a turn-back side, as appropriate) is the middle side in a so-called squared U-shape. The turn-back side is also referred to as, for example, the middle side of the three sides contained in the turn-back. Note that an example of a micro side group in a pattern figure, a turn-back in the micro side group, and a turn-back side corresponding to the turn-back is, for example, as in FIG. 2. If a micro side group has a turn-back, the number of turn-backs is one or more.

(1) If a micro side group does not have a turn-back, for example, the virtual side acquiring unit 13 acquires, as a virtual side, a line segment connecting points on two end sides contained in the micro side group. The line segment is also referred to as a line segment whose endpoints are points respectively on two end sides. The end sides are sides at the ends in the two or more micro sides contained in the micro side group. The end sides are also referred to as, for example, a first and a last side in a series of two or more micro sides forming a micro side group. The points on the end sides are typically endpoints. The endpoints are endpoints that are not the same as endpoints of other micro sides in the micro side group. That is to say, if the micro side group does not have a turn-back, the virtual side acquiring unit 13 typically acquires, as a virtual side, a line segment connecting the endpoints of the micro side group. The points on the end sides may be, for example, midpoints.

For example, it is assumed that one micro side group has two micro sides consisting of a side A and a side B. In this case, the end sides are the side A and the side B. The virtual side acquiring unit 13 acquires, as a virtual side, a line segment connecting one point on the side A and one point on the side B. For example, it is assumed that one micro side group has three micro sides consisting of a side A, a side B, and a side C. In this one micro side group, it is assumed that the three micro sides are continuously arranged in the order of the side A, the side B, and the side C. In this case, the end sides are the side A and the side C. The virtual side acquiring unit 13 acquires, as a virtual side, a line segment connecting one point on the side A and one point on the side C.

(2) If a micro side group has one or more turn-backs, for example, the virtual side acquiring unit 13 acquires virtual sides that are line segments sequentially connecting points respectively on one or more sides corresponding to the turn-backs and points respectively on two end sides contained in the micro side group. The sequentially connecting is connecting points in the order in which the micro sides are continuously arranged. The points on the turn-back sides are typically midpoints. The points on the end sides are typically endpoints. The endpoints are endpoints that are not the same as endpoints of other micro sides in the micro side group. That is to say, if the micro side group has one or more turn-backs, the virtual side acquiring unit typically acquires virtual sides that are line segments sequentially connecting the midpoints of the one or more turn-back sides and the endpoints of the micro side group. The points on the turn-back sides may be, for example, endpoints. The points on the end sides may be, for example, midpoints.

Furthermore, if the micro side group has one or more turn-backs, the virtual side acquiring unit 13 typically acquires "number of turn-backs+1" virtual sides. For example, if the number of turn-backs is one, the virtual side acquiring unit 13 typically acquires two virtual sides. If the number of turn-backs is two, the virtual side acquiring unit 13 typically acquires three virtual sides.

For example, it is assumed that one micro side group has continuously arranged micro sides from a side A to a side Q, wherein the side A and the side Q are end sides. In this one micro side group, it is assumed that a side K is a turn-back side. This means that the one micro side group has one turn-back. In this case, the virtual side acquiring unit 13 acquires, as virtual sides, a line segment connecting one point on the side A and one point on the side K and a line segment connecting one point on the side K and one point on the side Q. In this one micro side group, it is assumed that a side F and a side M are turn-back sides. This means that the one micro side group has two turn-backs. In this case, the virtual side acquiring unit 13 acquires a line segment connecting one point on the side A and one point on the side F, a line segment connecting one point on the side F and one point on the side M, and a line segment connecting one point on the side M and one point on the side Q. Note that the line segments acquired by the virtual side acquiring unit 13 are virtual sides.

The method, the procedure, and the like for acquiring information (virtual side information, in this example) indicating a line segment (virtual side, in this example) connecting two points are known techniques, and thus a detailed description thereof has been omitted.

The virtual side correction amount calculating unit 14 calculates one virtual side correction amount for each of the one or more virtual sides. That is to say, the virtual side correction amount calculating unit 14 calculates one or more virtual side correction amounts. The one or more virtual sides are the virtual sides acquired by the virtual side acquiring unit 13. The virtual side correction amount is, for example, a correction amount for a virtual side in the case where, in correction of a pattern figure, a micro side group contained in the pattern figure is replaced by the virtual side. In other words, the virtual side correction amount is a correction amount that is to be applied to a virtual side, assuming that, in correction of a pattern figure, a micro side group contained in the pattern figure is the virtual side. The correction amount is information indicating an amount of correction.

Furthermore, the virtual side correction amount is typically information indicating a magnitude and an orientation of a vector that is perpendicular to the virtual side. The magnitude is indicated by a numerical value. The orientation is indicated by a sign (plus or minus). There is no limitation on the relationship between the orientation and the sign. That is to say, for example, the orientation toward the inner side of the pattern figure may be taken as plus, and the orientation toward the outer side of the pattern figure may be taken as minus. Alternatively, for example, the orientation toward the outer side of the pattern figure may be taken as plus, and the orientation toward the inner side of the pattern figure may be taken as minus. That is to say, the orientation indicated by the virtual side correction amount indicates whether the virtual side is to be corrected toward the inner side of the pattern figure or toward the outer side of the pattern figure.

The method, the procedure, and the like for calculating a correction amount (virtual side correction amount, in this example) for a side (virtual side, in this example) contained in a pattern figure in MPC, OPC, and the like are known techniques, and thus a detailed description thereof has been omitted. The virtual side correction amount calculating unit 14 calculates a virtual side correction amount typically by taking a midpoint of a virtual side as a so-called evaluation point and calculating convolution of the point spread function at that evaluation point, for example.

The micro side correction amount calculating unit 15 calculates one micro side correction amount for each of two or more micro sides. The micro side correction amount is a correction amount for each of two or more micro sides acquired as a micro side group, in correction of a pattern figure. That is to say, the micro side correction amount calculating unit 15 calculates two or more micro side correction amounts. As in the case of the virtual side correction amount, the micro side correction amount is typically information indicating a magnitude and an orientation of a vector that is perpendicular to the micro side. Note that the magnitude, the orientation, and the like of the vector indicated by the micro side correction amount are similar to those indicated by the virtual side correction amount, and thus a description thereof has been omitted.

Furthermore, the two or more micro sides for which the micro side correction amounts are to be calculated are micro sides contained in a micro side group. The micro side group is one or more micro side groups acquired by the micro side group acquiring unit 12. That is to say, the micro side correction amount calculating unit 15 calculates two or more micro side correction amounts for each of the one or more micro side groups acquired by the micro side group acquiring unit 12.

Furthermore, the micro side correction amount calculating unit 15 calculates a micro side correction amount, using a virtual side correction amount. The virtual side correction amount is a virtual side correction amount calculated by the virtual side correction amount calculating unit 14 for each of the one or more virtual sides. The one or more virtual sides are the virtual sides acquired by the virtual side acquiring unit 13, and are the virtual sides respectively corresponding to the one or more micro side groups acquired by the micro side group acquiring unit 12. That is to say the micro side correction amount calculating unit 15 calculates two or more micro side correction amounts, using the virtual side correction amount calculated by the virtual side correction amount calculating unit 14 for one virtual side.

Furthermore, the micro side correction amount calculating unit 15 typically calculates two or more micro side correction amounts, using the virtual side correction amount and micro side angles. The micro side angles are angles of the micro sides relative to the virtual side. Specifically, a calculation formula for calculating a micro side correction amount is held, for example, in advance in the micro side correction amount calculating unit 15. The calculation formula has variables for which a virtual side correction amount and a micro side angle are to be substituted. The calculation formula is typically a formula for multiplying the virtual side correction amount by a coefficient based on the micro side angle. The micro side correction amount calculating unit 15 calculates a micro side correction amount by substituting the virtual side correction amount and the micro side angle for the calculation formula.

Figure 3:
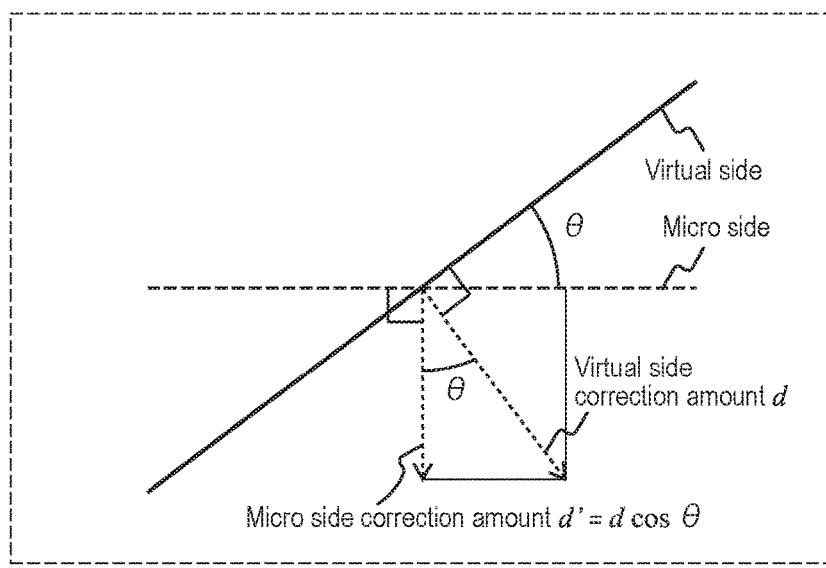
FIG. 3 is a diagram showing an example of calculation of a micro side correction amount of this embodiment.

For example, the calculation formula is a formula having a trigonometric function. For example, it is assumed that the angle between a virtual side corresponding to one micro side group and one micro side contained in the one micro side group is θ. Furthermore, it is assumed that the virtual side correction amount for the virtual side is d. In this case, the calculation formula is "dcosθ". The micro side correction amount is calculated using the calculation formula, for example, as in FIG. 3.

Furthermore, the calculation formula is, for example, a formula having a coefficient based on the ratio of the micro side angle relative to the right angle (90°). For example, as in the above-described case, it is assumed that the angle between a virtual side corresponding to one micro side group and one micro side contained in the one micro side group is θ. Furthermore, as in the above-described case, it is assumed that the virtual side correction amount for the virtual side is d. In this case, the calculation formula is "d{1−(θ/90)}". The calculation formula may be, for example, "d(θ/90)".

Furthermore, a turn-back side typically corresponds to two virtual sides. Accordingly two micro side correction amounts are typically calculated for a turn-back side. In this case, the micro side correction amount calculating unit 15 calculates an average of the two micro side correction amounts calculated for the turn-back side, as the micro side correction amount for the turn-back side. The average is typically a simple average. The average may be, for example, a weighted average. Weights used for the weighted average are, for example, a ratio of lengths of portions of the turn-back side divided at an endpoint of the virtual sides that matches a point on the turn-back side. That is to say, it is assumed that the length of turn-back side is 10, and that the lengths of portions of the turn-back side divided at the endpoint of the virtual sides are 4 and 6. In this case, the micro side correction amount calculating unit 15 uses "0.4" and "0.6" as the weights for the weighted average.

For example, the virtual side acquiring unit 13 associates each acquired virtual side, with the micro side group acquired by the micro side group acquiring unit 12 and used for acquiring the virtual side. The virtual side correction amount calculating unit 14 associates, for example, each acquired virtual side correction amount, with the virtual side acquired by the virtual side acquiring unit 13 and used for acquiring the virtual side correction amount. Accordingly, correspondence information between micro side groups, virtual sides, and virtual side correction amounts is constructed. The micro side correction amount calculating unit 15 calculates, for example, two or more micro side correction amounts, using the correspondence information.

The output unit 16 outputs the two or more micro side correction amounts. The output is typically transmission to an external display apparatus, accumulation in a storage medium, delivery to another program, or the like. The output may be, for example, display on a display screen, projection using a projector, printing by a printer, or the like. The two or more micro side correction amounts output by the output unit 16 are the micro side correction amounts calculated by the micro side correction amount calculating unit 15.

Furthermore, the output unit 16 may be considered to include or to not include an output device such as a display screen or a speaker. The output unit 16 may be realized by driver software for an output device, a combination of driver software for an output device and the output device, or the like.

The micro side group acquiring unit 12, the virtual side acquiring unit 13, the virtual side correction amount calculating unit 14, and the micro side correction amount calculating unit 15 may be realized typically by MPUs, memories, or the like. Typically, the processing procedure of the micro side group acquiring unit 12 and the like is realized by software, and the software is stored in a storage medium such as a ROM. Note that the micro side group acquiring unit 12 and the like may also be realized also by hardware (a dedicated circuit).

Figure 4:
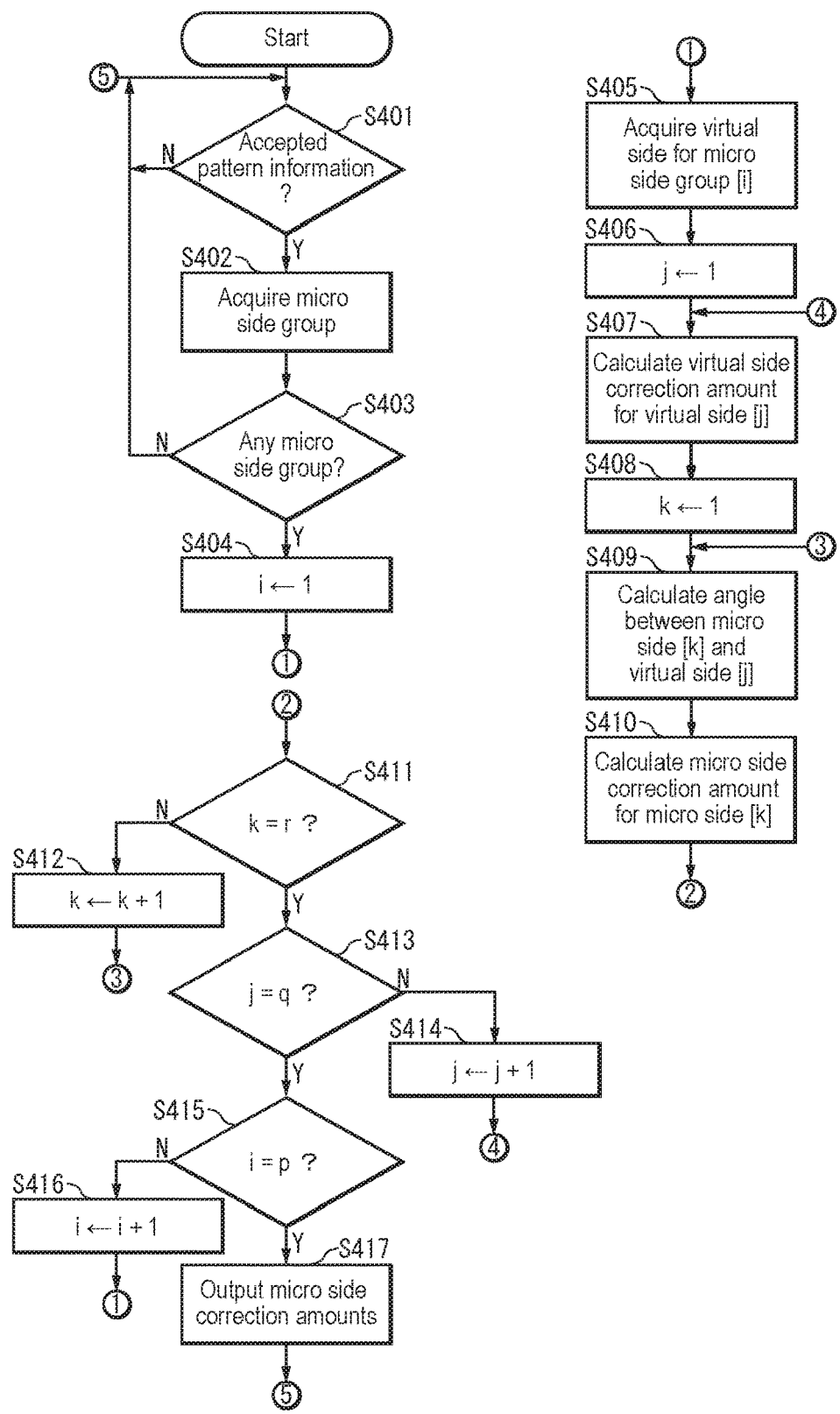
FIG. 4 is a flowchart illustrating the overall operation of the pattern correction amount calculating apparatus 1 of this embodiment.

Next, the overall operation of the pattern correction amount calculating apparatus 1 will be described with reference to the flowcharts. Note that an $i^{-th}$ piece of information in predetermined information is indicated as "information [i]". FIG. 4 is a flowchart illustrating the overall operation of the pattern correction amount calculating apparatus 1.

(Step S401) The micro side group acquiring unit 12 determines whether or not the accepting unit 11 has accepted pattern information. If accepted, the procedure advances to step S402, and, if not, the procedure returns to step S401.

(Step S402) The micro side group acquiring unit 12 acquires a micro side group from a pattern figure, using the pattern information accepted in step S401.

(Step S403) The virtual side acquiring unit 13 determines whether or not one or more micro side groups have been acquired in step S402. If acquired, the procedure advances to step S404, and, if not, the procedure returns to step S401.

(Step S404) The virtual side acquiring unit 13 sets 1 to a counter i. It is assumed that, in step S402, the micro side group acquiring unit 12 has acquired p micro side groups.

(Step S405) The virtual side acquiring unit 13 acquires one or more virtual sides for a micro side group [i]. The virtual side acquiring unit 13 associates the acquired one or more virtual sides, with the micro side group [i].

(Step S406) The virtual side correction amount calculating unit 14 sets 1 to a counter j. It is assumed that, in step S405, the virtual side acquiring unit 13 has acquired q virtual sides for the micro side group [i].

(Step S407) The virtual side correction amount calculating unit 14 calculates a virtual side correction amount for the virtual side [j] corresponding to the micro side group [i]. The virtual side correction amount calculating unit 14 associates the calculated virtual side correction amount, with the virtual side [j].

(Step S408) The micro side correction amount calculating unit 15 sets 1 to a counter k. It is assumed that the micro side group [i] has r micro sides.

(Step S409) The micro side correction amount calculating unit 15 calculates a micro side angle, which is an angle between the micro side [k] contained in the micro side group [i] and the virtual side [j] corresponding to the micro side group [i].

(Step S410) The micro side correction amount calculating unit 15 calculates a micro side correction amount for the micro side [k] contained in the micro side group [i], using the virtual side correction amount corresponding to the virtual side [j] and the micro side angle calculated in step S409.

(Step S411) The micro side correction amount calculating unit 15 determines whether or not k is r. If k is r, the procedure advances to step S413, and, if not, the procedure advances to step S412.

(Step S412) The micro side correction amount calculating unit 15 increments k by one. The procedure returns to step S409.

(Step S413) The virtual side correction amount calculating unit 14 determines whether or not j is q. If j is q, the procedure advances to step S415, and, if not, the procedure advances to step S414.

(Step S414) The virtual side correction amount calculating unit 14 increments j by one. The procedure returns to step S407.

(Step S415) The virtual side acquiring unit 13 determines whether or not i is p. If i is p, the procedure advances to step S417, and, if not, the procedure advances to step S416.

(Step S416) The virtual side acquiring unit 13 increments i by one. The procedure advances to step S405.

(Step S417) The output unit 16 outputs the two or more micro side correction amounts acquired in step S410.

Note that the procedure is terminated by powering off or an interruption at the end of the process in the flowchart in FIG. 4.

Figure 5:
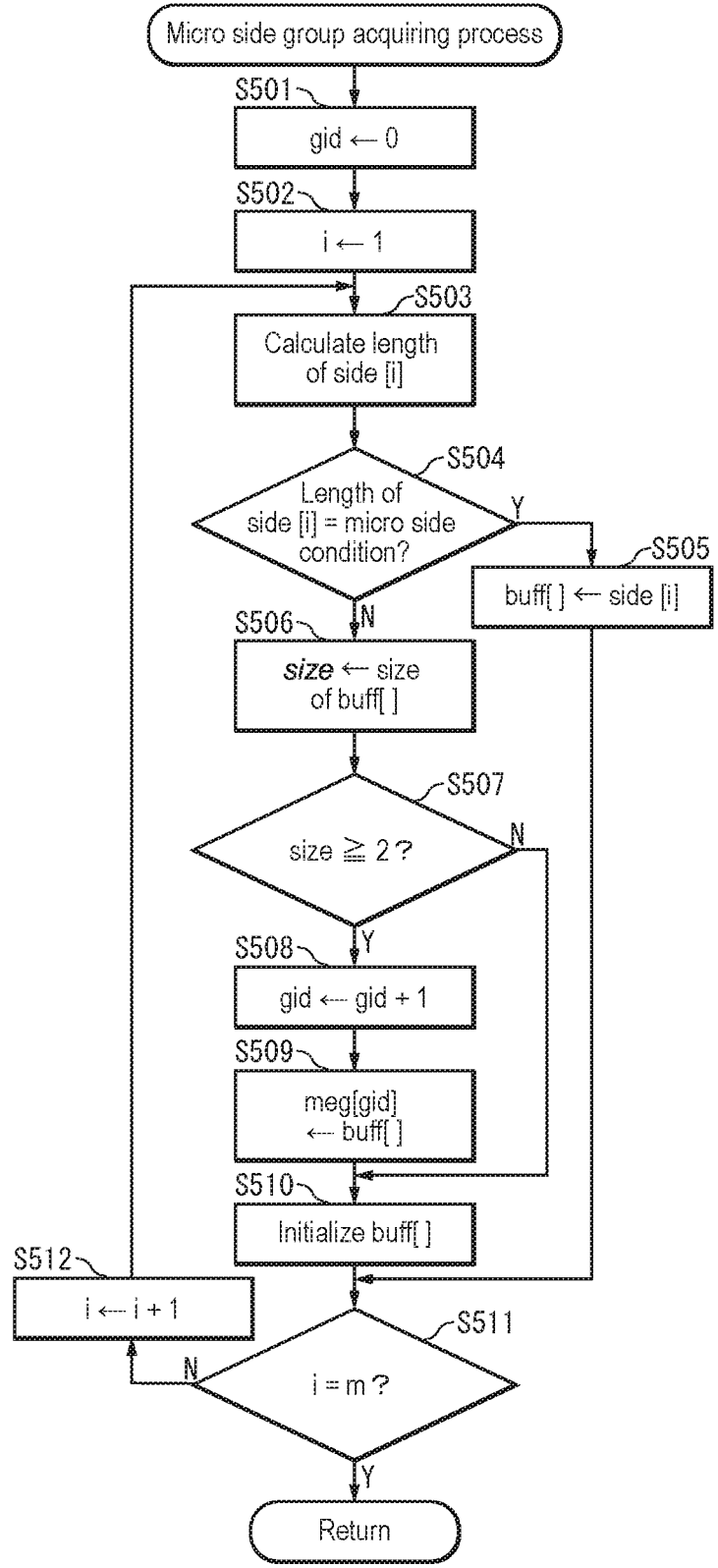
FIG. 5 is a flowchart illustrating a micro side group acquiring process of this embodiment.

A flowchart illustrating the micro side group acquiring process in step S402 in the flowchart in FIG. 4 is, for example, as in FIG. 5. FIG. 5 shows a case in which the pattern figure has m sides. In other words, it is assumed that the pattern information has information indicating m sides.

(Step S501) The micro side group acquiring unit 12 sets 0 to a variable gid. The gid is, for example, information for identifying a micro side group.

(Step S502) The micro side group acquiring unit 12 sets 1 to the counter i.

(Step S503) The micro side group acquiring unit 12 calculates a length of a side [i] contained in a pattern figure, using information indicating the side [i] contained in the pattern information.

(Step S504) The micro side group acquiring unit 12 determines whether or not the length of the side [i] calculated in step S503 satisfies the micro side condition. If the length satisfies the micro side condition, the procedure advances to step S505, and, if not, the procedure advances to step S506.

(Step S505) The micro side group acquiring unit 12 adds the side [i] to an array buff[ ]. Specifically, the micro side group acquiring unit 12 adds information indicating the side [i] to the buff[ ]. The procedure advances to step S511.

(Step S506) The micro side group acquiring unit 12 acquires the size of the buff[ ], and sets it to a variable size.

(Step S507) The micro side group acquiring unit 12 determines whether or not size is two or more. If size is two or more, the procedure advances to step S508, and, if not, the procedure advances to step S510.

(Step S508) The micro side group acquiring unit 12 increments gid by one.

(Step S509) The micro side group acquiring unit 12 sets the buff[ ] to the array element meg[gid]. The array meg[ ] is an array in which a micro side group is to be stored.

(Step S510) The micro side group acquiring unit 12 initializes the buff[ ].

(Step S511) The micro side group acquiring unit 12 determines whether or not i is m. If i is m, the procedure returns to the upper-level processing, and, if not, the procedure advances to step S512.

(Step S512) The micro side group acquiring unit 12 increments i by one. The procedure returns to step S503.

Figure 6:
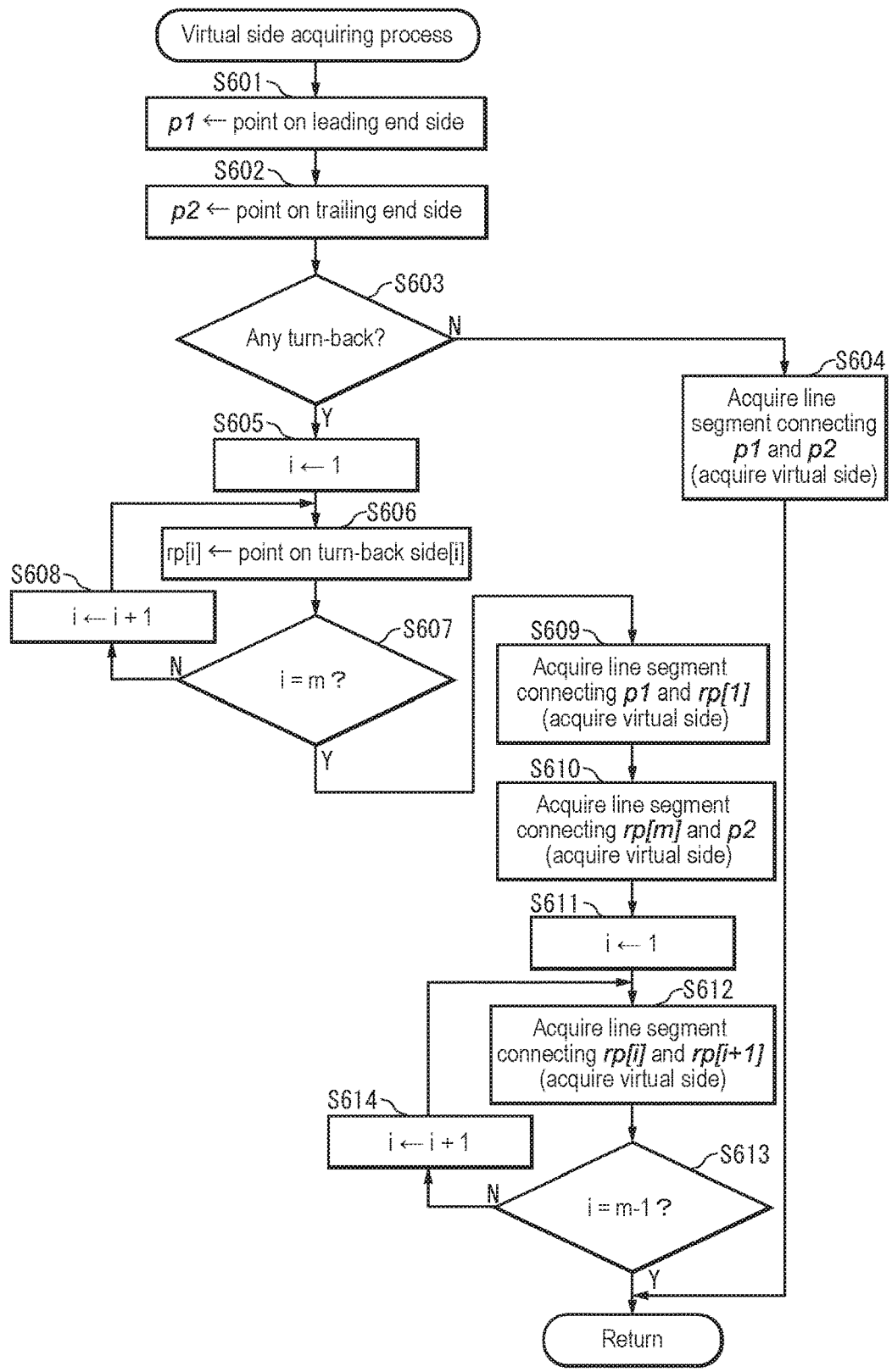
FIG. 6 is a flowchart illustrating a virtual side acquiring process of this embodiment.

A flowchart illustrating the virtual side acquiring process in step S405 in the flowchart in FIG. 4 is, for example, as in FIG. 6. FIG. 6 is a flowchart illustrating a process that acquires one or more virtual sides for one micro side group.

(Step S601) The virtual side acquiring unit 13 sets a point on a leading end side to a variable p1. The leading end side is a first side (end side) contained in the micro side group. Specifically, the virtual side acquiring unit 13 sets coordinates indicating a point on a leading end side to the variable p1.

(Step S602) The virtual side acquiring unit 13 sets a point on a trailing end side to a variable p2. The trailing end side is a last side (end side) contained in the micro side group. Specifically, the virtual side acquiring unit 13 sets coordinates indicating a point on a trailing end side to the variable p2.

(Step S603) The virtual side acquiring unit 13 determines whether or not the micro side group has a turn-back. If the micro side group has a turn-back, the procedure advances to step S605, and, if not, the procedure advances to step S604.

(Step S604) The virtual side acquiring unit 13 acquires a line segment connecting p1 and p2. Accordingly, a virtual side is acquired. The procedure returns to the upper-level processing.

(Step S605) The virtual side acquiring unit 13 sets 1 to the counter i. It is assumed that the micro side group has m turn-backs. In other words, it is assumed that the micro side group m turn-back sides.

(Step S606) The virtual side acquiring unit 13 sets a point on a turn-back side[i] to an array element rp[i]. Specifically the virtual side acquiring unit 13 sets coordinates indicating a point on the turn-back side[i] to the array element rp[i].

(Step S607) The virtual side acquiring unit 13 determines whether or not i is m. If i is m, the procedure advances to step S609, and, if not, the procedure advances to step S608.

(Step S608) The virtual side acquiring unit 13 increments i by one. The procedure returns to step S606.

(Step S609) The virtual side acquiring unit 13 acquires a line segment connecting p1 and rp[1] Accordingly, a virtual side is acquired.

(Step S610) The virtual side acquiring unit 13 acquires a line segment connecting rp[m] and p2. Accordingly, a virtual side is acquired.

(Step S611) The virtual side acquiring unit 13 sets 1 to the counter i.

(Step S612) The virtual side acquiring unit 13 acquires a line segment connecting rp[i] and rp[i+1]. Accordingly a virtual side is acquired.

(Step S613) The virtual side acquiring unit 13 determines whether or not i is m−1. If i is m−1, the procedure returns to the upper-level processing, and, if not, the procedure advances to step S614.

(Step S614) The virtual side acquiring unit 13 increments i by one. The procedure returns to step S612.

The above-described overall operation of the pattern correction amount calculating apparatus 1 is merely an example. That is to say, the overall operation of the pattern correction amount calculating apparatus 1 is not limited to the description above.

SPECIFIC EXAMPLES

Next, specific examples of an operation of the pattern correction amount calculating apparatus 1 will be described.

Example 1

In this example, a case will be described, for example, in which two or more micro side correction amounts are calculated for one micro side group having no turn-back.

Figure 8:
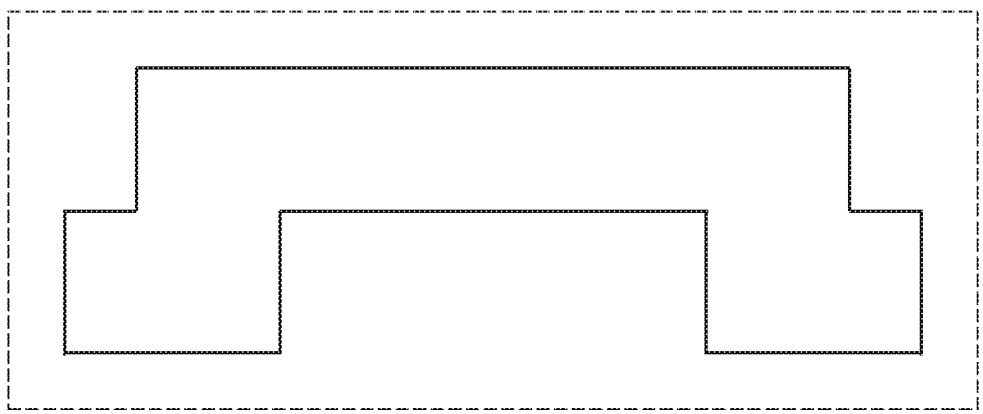
FIG. 8 is a diagram showing an example of a pattern figure of this embodiment.

First, the accepting unit 11 accepts pattern information. The pattern information is, for example, as in FIG. 7. In FIG. 7, each pieces of pattern information has an ID for uniquely specifying a record, and a coordinate pair indicating a side of a pattern figure (item names: Vertex 1, Vertex 2). The pattern figure indicated by the pattern information is, for example, as in FIG. 8. Note that the pattern figure is FIG. 8 is merely for the sake of convenience, and the pattern figure may be different from a figure actually indicated by the pattern information in FIG. 7.

Next, the micro side group acquiring unit 12 acquires a micro side group from the pattern figure, using the pattern information in FIG. 7. Specifically, the micro side group acquiring unit 12 acquires one or more pieces of micro side group information indicating a micro side group from the pattern information in FIG. 7. The micro side group information is, for example, as in FIG. 9. In FIG. 9, each piece of micro side group information has an ID for uniquely specifying a record, and a coordinate pair indicating a micro side contained in the micro side group (item names: Vertex 1, Vertex 2). The micro side group information is associated with information (item name: Group ID) for identifying a micro side group. That is to say, in FIG. 9, micro sides indicated by coordinate pairs associated with the same group ID are contained in that same micro side group. The micro side group indicated by the micro side group information associated with the group ID "004" in FIG. 9 is, for example, as in FIG. 10. Note that the micro side group in FIG. 10 is merely for the sake of convenience, and may be different from micro side group actually indicated by the micro side group information.

Figure 10:
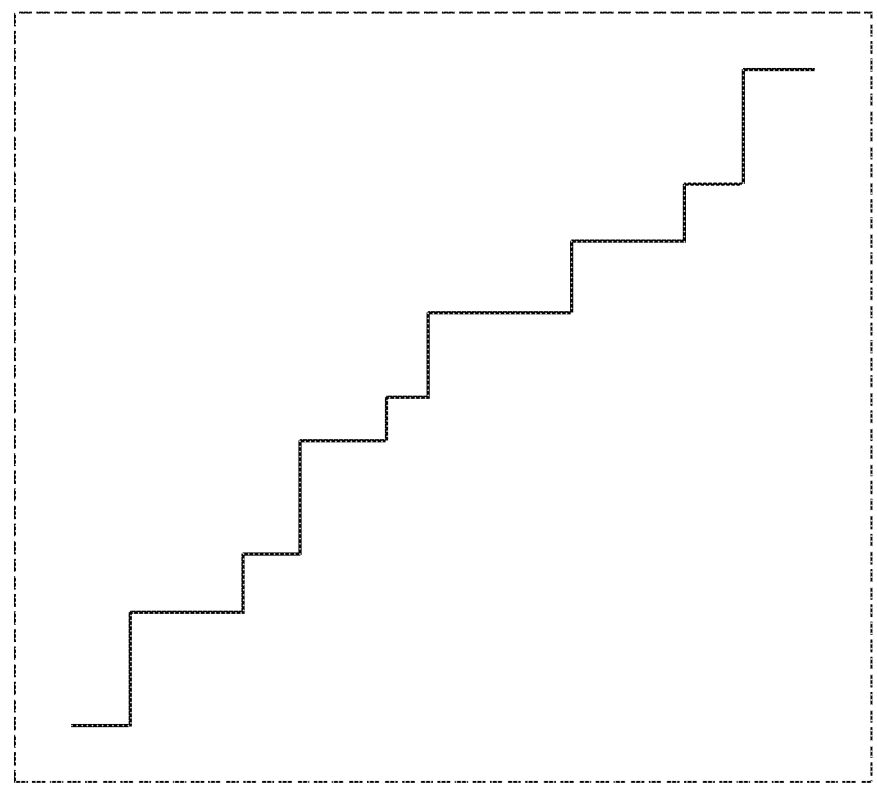
FIG. 10 is a diagram showing an example of a micro side group of this embodiment.

Next, the virtual side acquiring unit 13 acquires a virtual side for the micro side group in FIG. 10. Specifically, the virtual side acquiring unit 13 acquires, for example, two sets of coordinates indicating endpoints of the micro side group, from the micro side group information in FIG. 9. Using the acquired two sets of coordinates, the virtual side acquiring unit 13 calculates a formula indicating a line segment connecting the two sets of coordinates. The virtual side acquiring unit 13 substitutes, for example, x coordinates for the formula at predetermined intervals, thereby calculating y coordinates. The virtual side acquiring unit 13 calculates coordinates of two or more points forming the virtual side. The calculated two or more sets of coordinates are virtual side information. The virtual side indicated by the virtual side information calculated in this manner is, for example, as in FIG. 11. The virtual side acquiring unit 13 associates, for example, the calculated virtual side information, with the micro side group information in FIG. 9. A calculation result of the virtual side information of is, for example, as in FIG. 12. In FIG. 12, the virtual side information is "item name: Virtual side".

Figure 11:
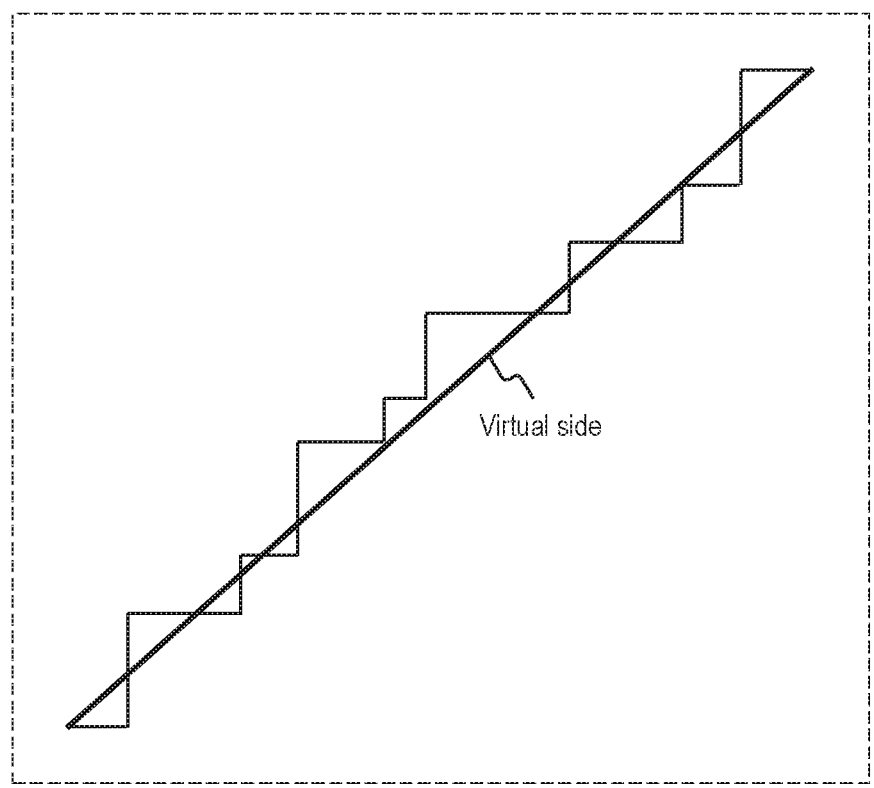
FIG. 11 is a diagram showing an example of a virtual side of this embodiment.

Next, using the calculated virtual side information, the virtual side correction amount calculating unit 14 calculates a virtual side correction amount for the virtual side in FIG. 11. At this time, for example, the virtual side correction amount calculating unit 14 calculates a virtual side correction amount taking a midpoint of the virtual side as an evaluation point. At this time, for example, the virtual side correction amount calculating unit 14 calculates a virtual side correction amount for the virtual side assuming that the micro side group acquired from the pattern figure has been replaced by this virtual side. The virtual side correction amount calculating unit 14 associates the calculated virtual side correction amount, with the information in FIG. 12. A calculation result of the virtual side correction amount is, for example, as in FIG. 13.

Next, using the calculated virtual side correction amount, the micro side correction amount calculating unit 15 calculates micro side correction amounts for the micro sides in FIG. 10. At this time, using a coordinate pair and virtual side information contained in each record in FIG. 13, the micro side correction amount calculating unit 15 calculates an angle between a micro side indicated by the coordinate pair and a virtual side indicated by the virtual side information. For example, if the micro side and the virtual side intersect each other, the micro side correction amount calculating unit 15 calculates the smaller angle of the two angles formed by the intersection. For example, if the micro side and the virtual side do not intersect each other, for example, the micro side correction amount calculating unit 15 extends the micro side, and calculates the smaller angle of the two angles formed by the intersection of the extended side and the virtual side. The micro side correction amount calculating unit 15 calculates a micro side correction amount, using the virtual side correction amount contained in each record in FIG. 13 and a micro side angle, which is the calculated angle. The micro side correction amount calculating unit 15 associates the calculated micro side correction amount, with the information in FIG. 13. A calculation result of the micro side correction amounts is, for example, as in FIG. 14.

Next, the output unit 16 outputs the micro side correction amounts in FIG. 14. At this time, the output unit 16 outputs the micro side correction amounts, for example, in association with information (ID in FIG. 14) for identifying micro sides that are to be corrected with the micro side correction amounts.

Example 2

In this example, a case will be described, for example, in which two or more micro side correction amounts are calculated for one micro side group having one turn-back. Note that a description of examples that have been already described in Example 1, such as examples for acquiring a micro side group, has been omitted as appropriate.

First, it is assumed that the micro side group acquiring unit 12 acquires a micro side group. It is assumed that the micro side group is as in FIG. 15. As described above, the micro side group in FIG. 15 has one turn-back.

Figure 15:
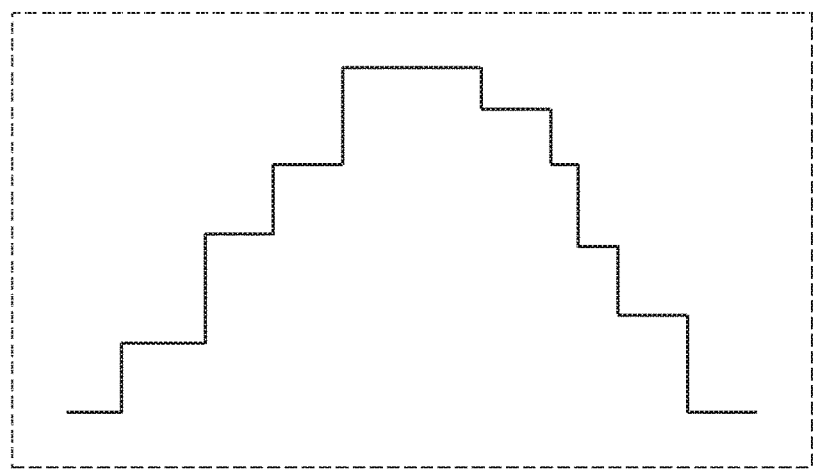
FIG. 15 is a diagram showing an example of a micro side group of this embodiment.

Next, the virtual side acquiring unit 13 acquires virtual sides for the micro side group in FIG. 15. Specifically the virtual side acquiring unit 13 acquires, for example, two sets of coordinates indicating endpoints of the micro side group, from the micro side group information that has been already acquired. Among the two sets of coordinates, a set of coordinates indicating a leading point are referred to as leading point coordinates, and a set of coordinates indicating a trailing point are referred to as trailing point coordinates. The virtual side acquiring unit 13 acquires, for example, a coordinate pair indicating a turn-back side contained in the micro side group, from the micro side group information that has been already acquired. The virtual side acquiring unit 13 calculates coordinates indicating a midpoint of the turn-back side, using the coordinate pair. The calculated coordinates are referred to as midpoint coordinates.

Next, using the leading point coordinates and the midpoint coordinates, the virtual side acquiring unit 13 calculates a formula indicating a line segment connecting the two sets of coordinates. The virtual side acquiring unit 13 calculates coordinates of two or more points forming the virtual side, using the calculated formula. Next, using the midpoint coordinates and the trailing point coordinates, the virtual side acquiring unit 13 calculates a formula indicating a line segment connecting the two sets of coordinates. The virtual side acquiring unit 13 calculates coordinates of two or more points forming the virtual side, using the calculated formula.

Figure 16:
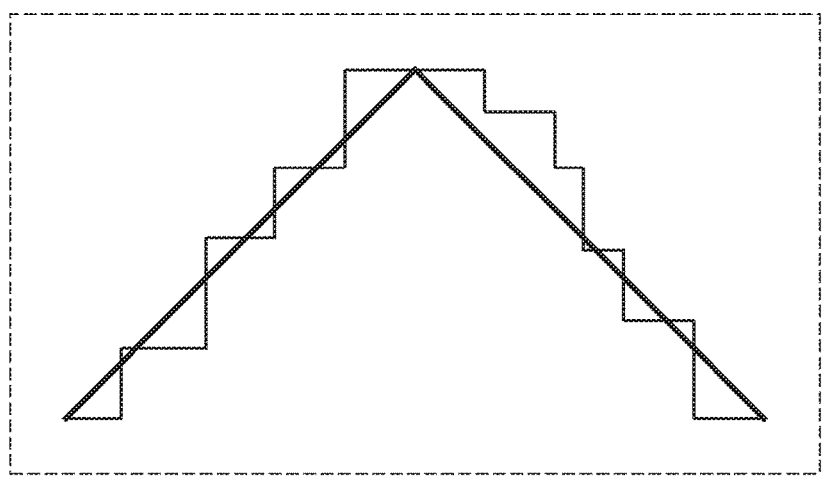
FIG. 16 is a diagram showing an example of virtual sides of this embodiment.

The virtual sides indicated by the virtual side information calculated in this manner are, for example, as in FIG. 16.

Example 3

In this example, a case will be described, for example, in which two or more micro side correction amounts are calculated for one micro side group having two turn-backs. Note that a description of examples that have been already described in Example 1, such as examples for acquiring a micro side group, has been omitted as appropriate.

First, it is assumed that the micro side group acquiring unit 12 acquires a micro side group. It is assumed that the micro side group is as in FIG. 17. As described above, the micro side group in FIG. 17 has two turn-backs.

Figure 17:
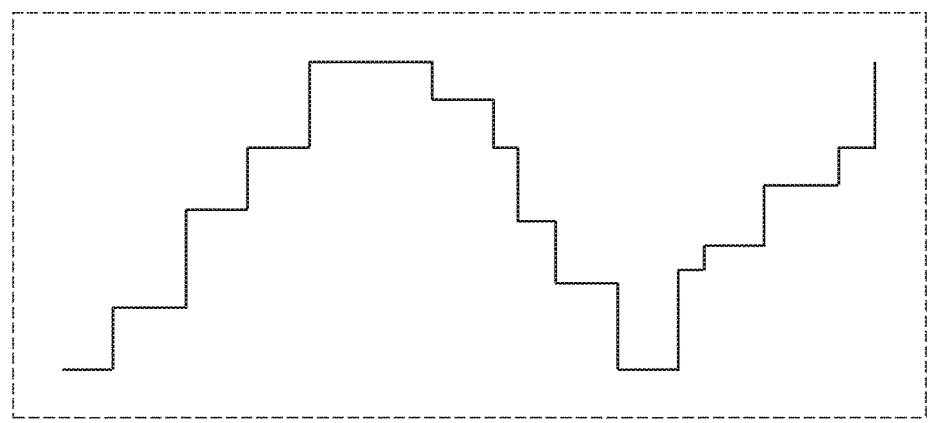
FIG. 17 is a diagram showing an example of a micro side group of this embodiment.

Next, the virtual side acquiring unit 13 acquires virtual sides for the micro side group in FIG. 17. Specifically, the virtual side acquiring unit 13 acquires, for example, two sets of coordinates indicating endpoints of the micro side group, from the micro side group information that has been already acquired. Among the two sets of coordinates, a set of coordinates indicating a leading point are referred to as leading point coordinates, and a set of coordinates indicating a trailing point are referred to as trailing point coordinates. The virtual side acquiring unit 13 acquires, for example, coordinate pairs indicating two turn-back sides contained in the micro side group, from the micro side group information that has been already acquired. The virtual side acquiring unit 13 calculates coordinates indicating midpoints of the two turn-back sides, using the two coordinate pairs. The calculated two sets of coordinates are respectively referred to as first midpoint coordinates and second midpoint coordinates in the order in which the micro sides are continuously arranged.

Next, using the leading point coordinates and the first midpoint coordinates, the virtual side acquiring unit 13 calculates a formula indicating a line segment connecting the two sets of coordinates. The virtual side acquiring unit 13 calculates coordinates of two or more points forming the virtual side, using the calculated formula. Next, using the first midpoint coordinates and the second midpoint coordinates, the virtual side acquiring unit 13 calculates a formula indicating a line segment connecting the two sets of coordinates. The virtual side acquiring unit 13 calculates coordinates of two or more points forming the virtual side, using the calculated formula. Next, using the second midpoint coordinates and the trailing point coordinates, the virtual side acquiring unit 13 calculates a formula indicating a line segment connecting the two sets of coordinates. The virtual side acquiring unit 13 calculates coordinates of two or more points forming the virtual side, using the calculated formula.

Figure 18:
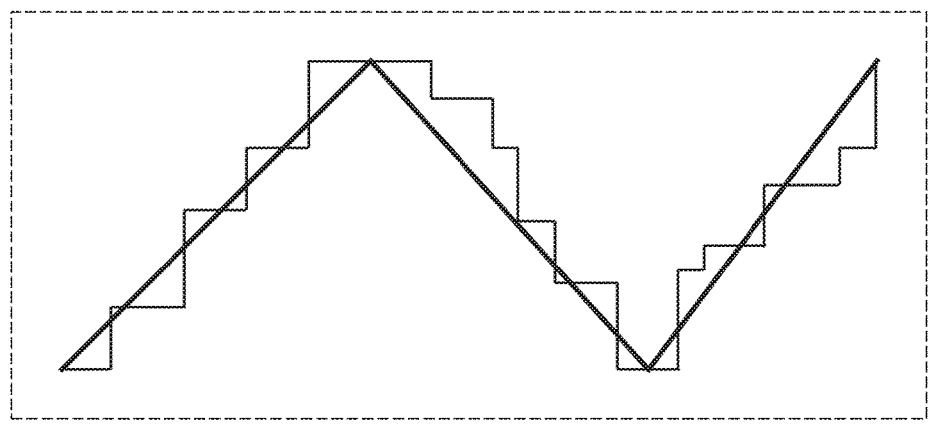
FIG. 18 is a diagram showing an example of virtual sides of this embodiment.

The virtual sides indicated by the virtual side information calculated in this manner are, for example, as in FIG. 18.

As described above, according to the pattern correction amount calculating apparatus 1 in this embodiment, it is possible to calculate a proper correction amount for each of two or more continuous micro sides. As a result, it is possible to correct a pattern figure, without causing shape deformation of the pattern figure.

Figure 19:
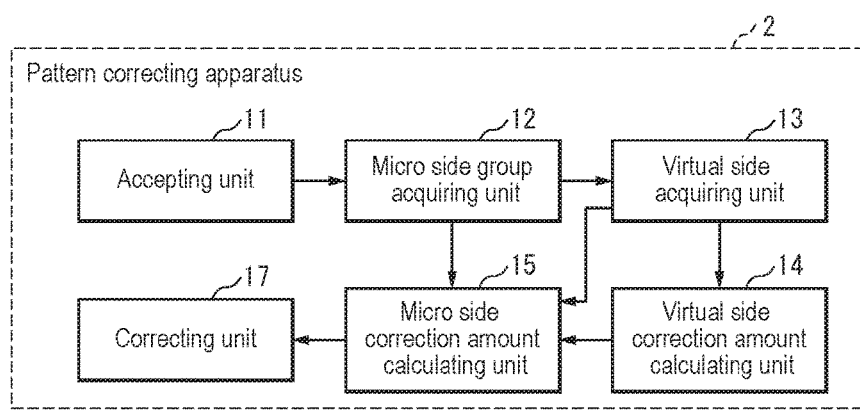
FIG. 19 is a block diagram of a pattern correcting apparatus 2 of this embodiment.

Note that, for example, the pattern correction amount calculating apparatus 1 in this embodiment may correct a pattern figure. The pattern correction amount calculating apparatus 1 that corrects a pattern figure is referred to as a pattern correcting apparatus 2. The pattern correcting apparatus 2 includes, for example, the accepting unit 11, the micro side group acquiring unit 12, the virtual side acquiring unit 13, the virtual side correction amount calculating unit 14, the micro side correction amount calculating unit 15, and a correcting unit 17. The correcting unit 17 calculates, for example, correction amounts for sides other than those in micro side groups, among three or more sides contained in a pattern figure, using the pattern information accepted by the accepting unit 11. The correcting unit 17 corrects, for example, the pattern figure, using the calculated correction amounts and the two or more micro side correction amounts calculated by the micro side correction amount calculating unit 15. The correcting a pattern figure is acquiring information indicating a pattern figure after correction, using pattern information. The method, the procedure, and the like for calculating correction amounts for sides other than those in micro side groups are known techniques, and thus a detailed description thereof has been omitted. The correcting unit 17 may be realized by, for example, an MPU, a memory, or the like. Typically, the processing procedure of the correcting unit 17 and the like is realized by software, and the software is stored in a storage medium such as a ROM. Note that the correcting unit 17 and the like may also be realized also by hardware (a dedicated circuit). A block diagram of the pattern correcting apparatus 2 is, for example, as in FIG. 19.

Figure 20:
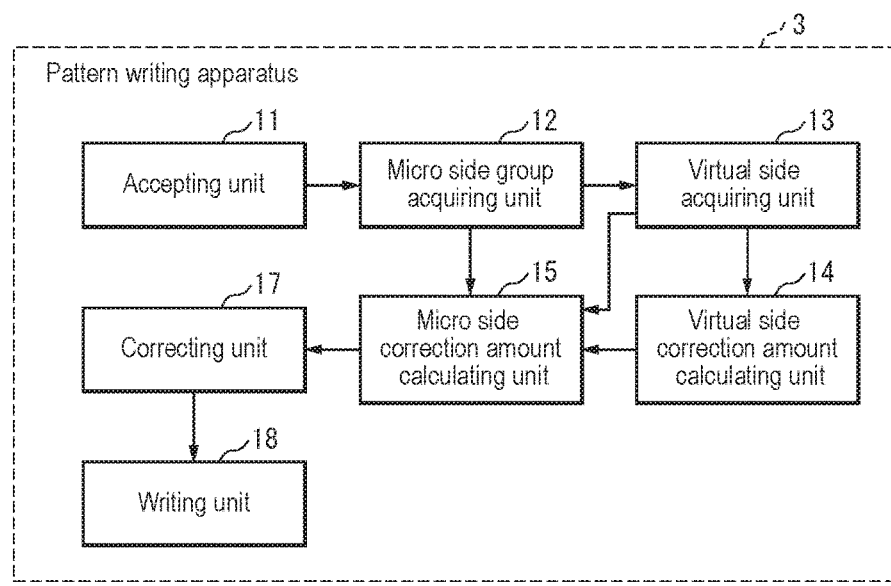
FIG. 20 is a block diagram of a pattern writing apparatus 3 of this embodiment.

Furthermore, for example, the above-described pattern correcting apparatus 2 may write a pattern figure after correction. If the pattern correcting apparatus 2 that writes a pattern figure after correction is referred to as a pattern writing apparatus 3, the pattern writing apparatus 3 includes, for example, a writing unit 18 in addition to the units included in the pattern correcting apparatus 2 described above. For example, using information indicating a pattern figure after correction acquired by the correcting unit 17, the writing unit 18 writes the pattern figure after correction indicated by the information. There is no limitation on an object on which the drawing is to be performed. The drawing is to be performed, for example, on a photomask, a wafer, or the like. The writing unit 18 may be typically realized by a field emission-type, Schottky-type, or thermionic-type electron gun, an electronic lens, a height detector, or the like. Typically, the processing procedure of the writing unit 18 is realized by software, and the software is stored in a storage medium such as a ROM. A block diagram of the pattern writing apparatus 3 is, for example, as in FIG. 20.

Furthermore, the pattern correction amount calculating apparatus in the foregoing embodiment may be, for example, either a stand-alone apparatus or a server apparatus in a server-client system.

Furthermore, in the foregoing embodiment, each process or each function may be realized as centralized processing using a single apparatus or a single system, or may be realized as distributed processing using multiple apparatuses.

Furthermore, in the foregoing embodiment, each constituent element may be configured by dedicated hardware, or, alternatively, constituent elements that can be realized by software may be realized by executing a program. For example, each constituent element may be realized by a program execution unit such as a CPU reading and executing a software program stored in a storage medium such as a hard disk or a semiconductor memory.

The software that realizes the pattern correction amount calculating apparatus in the foregoing embodiment may be the following sort of program. Specifically, this program is a program for causing a computer to function as: an accepting unit that accepts pattern information, which is information indicating a pattern figure that is to be written by an electron beam writer; a micro side group acquiring unit that acquires a micro side group, which is a group of two or more continuous sides forming a contour of the pattern figure indicated by the pattern information, and is a group of micro sides that are each small enough to satisfy a predetermined condition, using the pattern information; a virtual side acquiring unit that acquires a virtual side, which is a side that approximates two or more micro sides contained in the micro side group; a virtual side correction amount calculating unit that calculates a virtual side correction amount, which is a correction amount for the virtual side; a micro side correction amount calculating unit that calculates two or more micro side correction amounts, which are correction amounts respectively for the two or more micro sides contained in the micro side group corresponding to the virtual side, using the virtual side correction amount; and an output unit that outputs the two or more micro side correction amounts.

In the programs, the functions realized by the programs do not include functions that can be realized only by hardware.

Furthermore, the programs may be executed by downloads from a server or the like, or may be executed by reading a program stored in a predetermined storage medium (e.g., an optical disk such as a CD-ROM, a magnetic disk, a semiconductor memory, etc.). Furthermore, the program may be used as a program forming a program product.

Furthermore, the computer that executes this program may be a single computer, or may be multiple computers. That is to say, centralized processing may be performed, or distributed processing may be performed.

Figure 21:
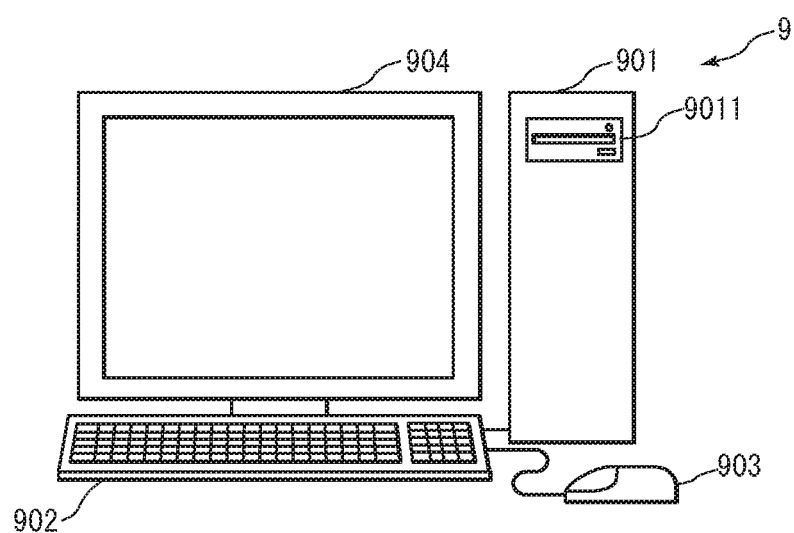
FIG. 21 is a schematic view of a computer system of this embodiment.

FIG. 21 is a schematic view showing a computer system 9 that executes the programs described above to realize the pattern correction amount calculating apparatus and the like in the foregoing embodiment. The foregoing embodiment may be realized using computer hardware and computer programs executed thereon.

In FIG. 21, the computer system 9 is provided with a computer 901 including a CD-ROM drive 9011, a keyboard 902, a mouse 903, and a monitor 904.

Figure 22:
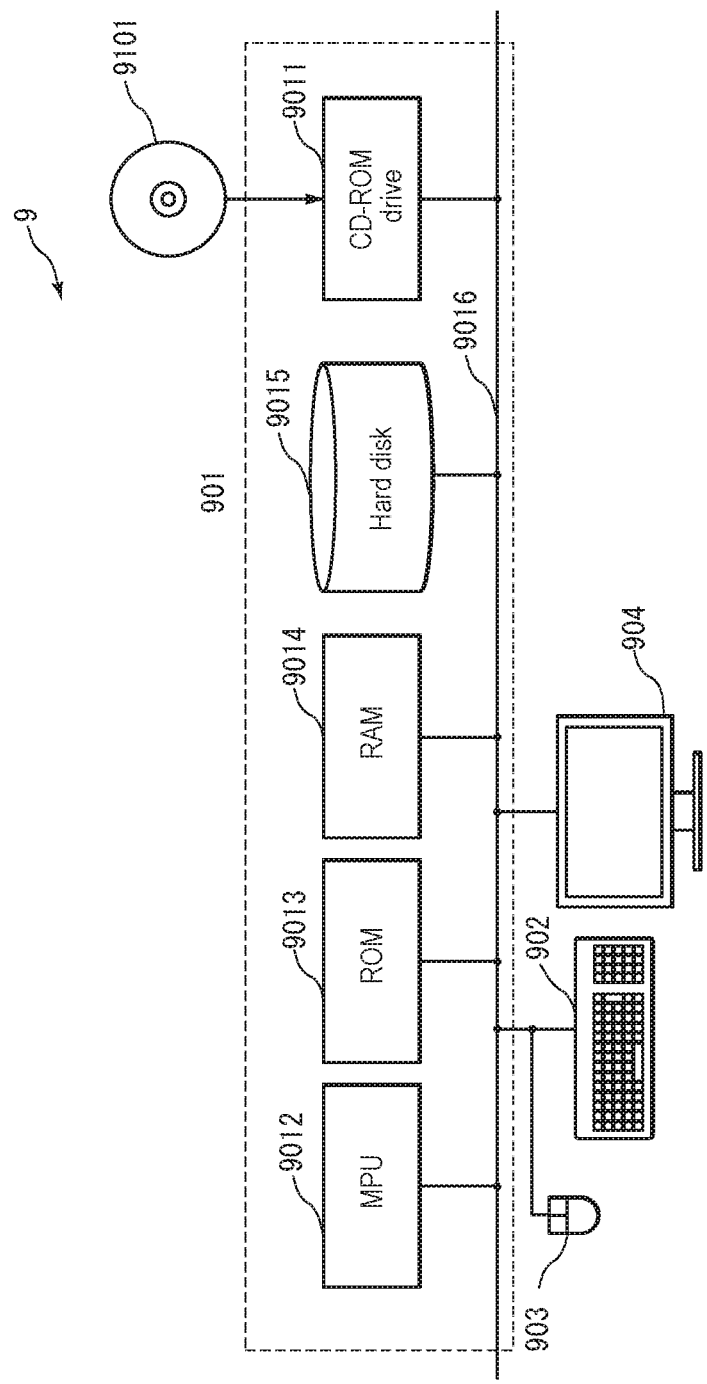
FIG. 22 is a block diagram of the computer system of this embodiment.

FIG. 22 is a block diagram of the computer system 9. In FIG. 22, the computer 901 is provided with, in addition to the CD-ROM drive 9011, an MPU 9012, a ROM 9013 in which a program such as a boot up program is to be stored, an RAM 9014 that is connected to the MPU 9012 and is a memory in which a command of an application program is temporarily stored and a temporary storage area is provided, a hard disk 9015 in which an application program, a system program, and data are stored, and a bus 9016 that connects the CD-ROM drive 9011, the MPU 9012, and the like. Although not shown, the computer 901 may further include a network card that provides connection to a LAN.

The program for causing the computer system 9 to execute the functions of the pattern correction amount calculating apparatus and the like in the foregoing embodiment may be stored in a CD-ROM 9101 that is inserted into the CD-ROM drive 9011, and be transmitted to the hard disk 9015. Alternatively the program may be transmitted via an unshown network to the computer 901 and stored in the hard disk 9015. At the time of execution, the program is loaded into the RAM 9014. The program may be loaded from the CD-ROM 9101 or directly from a network.

The program does not necessarily have to include, for example, an operating system (OS) or a third party program to cause the computer 901 to execute the functions of the pattern correction amount calculating apparatus and the like in the foregoing embodiment. The program may only include a command portion to call an appropriate function (module) in a controlled mode and obtain desired results. The manner in which the computer system 9 operates is well known, and thus a detailed description thereof has been omitted.

The present invention is not limited to the embodiment set forth herein. Various modifications are possible within the scope of the present invention.

INDUSTRIAL APPLICABILITY

As described above, the pattern correction amount calculating apparatus according to the present invention has an effect that a proper correction amount for each of two or more continuous micro sides can be calculated, and thus this apparatus is useful as a semiconductor designing apparatus, an electron beam writer, and the like.

LIST OF REFERENCE NUMERALS

1 Pattern correction amount calculating apparatus
11 Accepting unit
12 Micro side group acquiring unit
13 Virtual side acquiring unit
14 Virtual side correction amount calculating unit
15 Micro side correction amount calculating unit
16 Output unit

The invention claimed is:

1. A pattern correction amount calculating apparatus, comprising:
   an accepting unit that accepts pattern information, which is information indicating a pattern figure that is to be written by an electron beam writer;
   a micro side group acquiring unit that acquires a micro side group, which is a group of two or more continuous sides forming a contour of the pattern figure indicated by the pattern information, and is a group of micro sides that are each small enough to satisfy a predetermined condition, using the pattern information;
   a virtual side acquiring unit that acquires a virtual side, which is a side that approximates two or more micro sides contained in the micro side group;
   a virtual side correction amount calculating unit that calculates a virtual side correction amount, which is a correction amount for the virtual side and is information regarding a change of position of an entirety of the virtual side;
   a micro side correction amount calculating unit that calculates, using the virtual side correction amount, two or more micro side correction amounts, which are correction amounts respectively for the two or more micro sides contained in the micro side group corresponding to the virtual side, are correction amounts according to the vertical side correction amount and are information regarding a change of a position of an entirety of each of the two or more micro sides; and
   an output unit that outputs the two or more micro side correction amounts.

2. The pattern correction amount calculating apparatus according to claim 1, wherein the virtual side acquiring unit acquires, as a virtual side, a line segment connecting points respectively on two end sides contained in the micro side group.

3. The pattern correction amount calculating apparatus according to claim 1, wherein, in a case where the micro side group has one or more turn-backs, the virtual side acquiring unit acquires, as virtual sides, two or more line segments sequentially connecting points respectively on one or more sides corresponding to the turn-backs and points respectively on two end sides contained in the micro side group.

4. The pattern correction amount calculating apparatus according to claim 2, wherein the points on the end sides are endpoints of the end sides.

5. The pattern correction amount calculating apparatus according to claim 3, wherein the points on the sides corresponding to the turn-backs are midpoints of the sides corresponding to the turn-backs.

6. The pattern correction amount calculating apparatus according to claim 1, wherein the micro side correction amount calculating unit calculates the two or more micro side correction amounts, using the virtual side correction amount, and angles of the two or more micro sides contained in the micro side group relative to the virtual side.

7. The pattern correction amount calculating apparatus according to claim 6, wherein the micro side correction amount calculating unit calculates the two or more micro side correction amounts, by dividing the virtual side correction amount into components of angles of the two or more micro sides contained in the micro side group relative to the virtual side, using a trigonometric function.

8. The pattern correction amount calculating apparatus according to claim 1, wherein each of the micro sides has a length of 100 nanometers or less.

9. The pattern correction amount calculating apparatus according to claim 1, wherein two or more sides forming the pattern figure are sides in which two adjacent sides form a right angle.

10. A pattern correction amount calculating method performed using an accepting unit, a micro side group acquiring unit, a virtual side acquiring unit, a virtual side correction amount calculating unit, a micro side correction amount calculating unit, and an output unit, comprising:
  an accepting step of the accepting unit accepting pattern information, which is information indicating a pattern figure that is to be written by an electron beam writer;
  a micro side group acquiring step of the micro side group acquiring unit acquiring a micro side group, which is a group of two or more continuous sides forming a contour of the pattern figure indicated by the pattern information, and is a group of micro sides that are each small enough to satisfy a predetermined condition, using the pattern information;
  a virtual side acquiring step of the virtual side acquiring unit acquiring a virtual side, which is a side that approximates two or more micro sides contained in the micro side group;
  a virtual side correction amount calculating step of the virtual side correction amount calculating unit calculating a virtual side correction amount, which is a correction amount for the virtual side and is information regarding a change of position of an entirety of the virtual side;
  a micro side correction amount calculating step of the micro side correction amount calculating unit calculating, using the virtual side correction amount, two or more micro side correction amounts, which are correction amounts respectively for the two or more micro sides contained in the micro side group corresponding to the virtual side, are correction amounts according to the vertical side correction amount and are information regarding a change of a position of an entirety of each of the two or more micro sides; and
  an output step of the output unit outputting the two or more micro side correction amounts.

11. A non-transitory computer readable storage medium in which a program is stored, the program causing a computer to function as:
  an accepting unit that accepts pattern information, which is information indicating a pattern figure that is to be written by an electron beam writer;
  a micro side group acquiring unit that acquires a micro side group, which is a group of two or more continuous sides forming a contour of the pattern figure indicated by the pattern information, and is a group of micro sides that are each small enough to satisfy a predetermined condition, using the pattern information;
  a virtual side acquiring unit that acquires a virtual side, which is a side that approximates two or more micro sides contained in the micro side group;
  a virtual side correction amount calculating unit that calculates a virtual side correction amount, which is a correction amount for the virtual side and is information regarding a change of position of an entirety of the virtual side;
  a micro side correction amount calculating unit that calculates, using the virtual side correction amount, two or more micro side correction amounts, which are correction amounts respectively for the two or more micro sides contained in the micro side group corresponding to the virtual side, are correction amounts according to the vertical side correction amount and are information regarding a change of a position of an entirety of each of the two or more micro sides; and
  an output unit that outputs the two or more micro side correction amounts.

* * * * *